United States Patent [19]

Peterson

[11] Patent Number: 5,103,118
[45] Date of Patent: Apr. 7, 1992

[54] HIGH SPEED ANTI-UNDERSHOOT AND ANTI-OVERSHOOT CIRCUIT

[75] Inventor: Craig M. Peterson, Old Orchard Beach, Me.

[73] Assignee: National Semiconductor Corporation, Santa Clara, Calif.

[21] Appl. No.: 615,077

[22] Filed: Nov. 19, 1990

[51] Int. Cl.$^5$ .......................................... H03K 17/14
[52] U.S. Cl. ................................. 307/443; 307/451; 307/542; 307/572
[58] Field of Search ................ 307/443, 451, 542, 572

[56] References Cited

U.S. PATENT DOCUMENTS

| | | | |
|---|---|---|---|
| 4,961,010 | 10/1990 | Davis | 307/443 |
| 4,992,677 | 2/1991 | Ishibashi et al. | 307/443 |
| 5,017,807 | 5/1991 | Kriz et al. | 307/451 |

Primary Examiner—Stanley D. Miller
Assistant Examiner—Scott A. Ouellette
Attorney, Agent, or Firm—James W. Rose; Daniel H. Kane

[57] ABSTRACT

An anti-noise circuit dissipates parasitic tank circuit energy which causes ground unershoot and $V_{cc}$ overshoot in the power rails (PG,PV) of an integrated circuit device. An anti-noise circuit transistor element, either an anti-undershoot circuit transistor element (AUCT) or an anti-overshoot circuit transistor element (AOCT) incorporates selected resistance in its primary current path for providing dissipating resistance. The anti-noise circuit couples a current source (PV), the anti-noise circuit transistor element (AUCT, AOCT) with dissipating resistance, and power rail parasitic lead inductance in series in a sacrificial current path. A control circuit coupled to the control node of the anti-noise circuit transistor element (AUCT,AOCT) causes sacrificial current flow following switching of potential levels at the output for dissipating parasitic tank circuit energy. The control circuit incorporates an active pullup and pulldown passgate (RST1,ICT1,OCT1) (RST2,ICT3, OCT2) between the data input ($V_{IN}$) and the control node of the anti-noise circuit transistor element. The passgate includes a pullup passgate transistor element (RST1,ICT3) and a pulldown passgate transistor element (ICT1,RST2) coupled for active turn off of the anti-noise circuit transistor element following a switching of potential levels at the data input ($V_{IN}$).

20 Claims, 4 Drawing Sheets

HIGH SPEED ANTI-UNDERSHOOT AND ANTI-OVERSHOOT CIRCUIT

CROSS REFERENCE TO RELATED PATENT APPLICATION

This patent application is related to the Alan C. Rogers U.S. Pat. No. 5,049,763 for ANTI-NOISE CIRCUITS, issued Sept. 17, 1991, and is assigned to the same assignee. The contents of this related patent application are incorporated herein by reference.

TECHNICAL FIELD

This invention relates to an improved anti-noise circuit for dissipating parasitic tank circuit energy in the ground and supply rails of integrated circuits and is particularly applicable for high speed, high frequency integrated circuit devices. The anti-noise circuit is provided for dissipating ground undershoot energy, power supply overshoot energy, and subsequent ringing in the ground and power supply rails of integrated circuit output buffers. The invention provides an improvement and enhancement of the anti-noise circuit described in the related U.S. patent application Ser. No. 327,348 for fast turn off of the anti-undershoot and anti-overshoot circuit paths for high frequency applications.

BACKGROUND ART

The anti-undershoot circuit for single stage and multistage circuits described in U.S. patent application Ser. No. 327,348 incorporates an anti-overshoot circuit transistor element AUCT having the primary current path first and second nodes coupled in an anti-undershoot circuit. The AUCT is coupled between a current source such as a $V_{CC}$ output supply PV and an output ground PG and through the output ground lead inductance to the external ground and output capacitance. An AUCT control circuit is arranged for establishing transient flow of a sacrificial current through the AUCT primary current path from the output supply current source and through the output ground lead inductance to external ground following transition from high to low potential at the output. The AUCT parameters and dimensions are constructed to provide selected resistance in the primary current path in the conducting state for dissipating undershoot electrical energy stored in the output ground lead inductance thereby damping ground potential undershoot and subsequent ringing in the output ground.

The basic elements of an anti-overshoot circuit similarly include an off chip power supply current source for supplying the transient sacrificial current, an anti-overshoot transistor element AOCT, and a control circuit for initiating transient flow of sacrificial current through the anti-overshoot circuit transistor element AOCT following transition from low to high potential at the output. The anti-overshoot circuit couples the parasitic supply lead inductance in the sacrificial current path along with dissipating resistance. Parasitic tank circuit energy stored in the supply lead inductance is thereby dissipated in the dissipating resistance. This dissipating resistance is typically provided by the channel resistance of the anti-overshoot circuit transistor AOCT in a manner similar to the AUCT.

A low noise circuit described in the related U.S. patent application Ser. No. 327,348 is illustrated in FIG. 1. FIG. 1 of the present patent application is the same as FIG. 24 of U.S. Pat. No. 327,348. The combined low noise circuit is incorporated in a tristate output stage of, for example, an octal buffer line driver. This tristate output buffer incorporates both an anti-bounce circuit for suppressing ground bounce and an anti-undershoot circuit for rapidly dissipating ground undershoot energy. The tristate output buffer of FIG. 1 is noninverting so that a high potential level data signal appears at the output $V_{OUT}$ after a high level data signal is applied at the input $V_{IN}$. This is accomplished by two stages of current amplification with inversion, the first stage including the complementary pair of MOS transistors P1 and N1, and a second stage which includes the output pullup transistor element P2 and pulldown transistor element N2. The pulldown transistor N2 is shown in a form which permits user selection of the size of transistor N2.

The anti-undershoot circuit incorporates a PMOS anti-undershoot circuit transistor AUCT with its primary current path operatively coupled between the output supply PV and through the output $V_{OUT}$ to the output ground PG for establishing transient sacrificial current flow following transition from high to low potential at the output $V_{OUT}$. The channel width of the AUCT, for example 240 microns, is selected to provide the desired resistance for critically damping and rapidly dissipating ground undershoot energy. The AUCT is normally not conducting because its PMOS gate is supplied with charge by the output supply PV through the AUCT control path resistance CPR and the anti-undershoot switch transistor AUST. In this example the CPR is provided by a gate grounded PMOS transistor with small channel width of for example 14 microns and length of 21 microns providing the desired resistance to current during charging and discharge of the gate of the AUCT.

The anti-undershoot switch transistor AUST is normally conducting with its gate coupled to a ground undershoot detector GUD circuit such as the circuit of FIG. 2 which provides a ground undershoot signal GUS normally at low potential in the absence of detected ground undershoot. A transient GUS of high potential is provided during occurrence and detection of ground undershoot in excess of the threshold differential of the GUD circuit.

The gate of the AUCT is also coupled to ground via the output $V_{OUT}$ by two logic condition transistors, a data input condition transistor ICT1 and a data output condition transistor OCT. As long as either of the NMOS transistors ICT1 and OCT is off, the charge at the gate of the AUCT cannot escape and the AUCT remains nonconducting.

During normal operation of the tristate output buffer in the bistate mode, enabled by a high level OE signal, and with a high level data signal at the output $V_{OUT}$, the output condition network OCN delivers a high level signal charging the gate of NMOS output condition transistor OCT. The OCT is therefore already conducting. Upon receipt of a low level data signal at the input $V_{IN}$, the inverting data enable network or data input network DIN charges the gate of input condition transistor ICT1 so that ICT1 also becomes conducting. During the transition of $V_{OUT}$ to a low level, the now conducting logic condition transistors ICT1 and OCT discharge the gate of the AUCT for transient flow of sacrificial current through the AUCT primary current path. It is noted that as long as the output device is in the bistate mode of operation with a high level OE signal, the output enable condition transistor OECT1 is not conducting and does not interfere in the operation of the AUCT. In the high impedance third state the OECT1 functions as a tristate control transistor turning off the AUCT.

Following the propagation delay through the output buffer and transition of the output $V_{OUT}$ from high to low potential, the network OCN turns off the output condition transistor OCT. As a result current flow from the output power supply PV begins to charge the gate of the AUCT through the CPR and AUST. The control path resistance CPR slows the charging of the gate of PMOS transistor AUCT therefore delaying the turn off of AUCT permitting the transient flow of sacrificial current through the primary conducting path of the AUCT following transition from high to low potential at the output $V_{OUT}$.

If a ground undershoot event is detected a high level transient GUS turns off the switch transistor AUST increasing resistance in the path of current charging the gate of the AUCT further suppressing or retarding the turn off of sacrificial current flow. The sacrificial current flow is therefore prolonged during the transient occurrence of the detected ground undershoot event.

The sacrificial current flow $I_{AUCT}$ rises during the transition from high to low potential at the output $V_{OUT}$ and continues following the transition until the gate of the AUCT is charged. With the AUST interposing a high resistance for the duration of a transient GUS, the transient $I_{AUCT}$ is prolonged for further dissipation of ground undershoot energy. An advantage of coupling the AUCT to the output through the OCT and OCN is that the OCN and OCT prevent a fast rise in current through the primary current path of the AUCT and instead produce a more gradual concave rise time. Avoiding the fast rise avoids further disruption, noise and ringing in the power supply circuit and reduces power consumption.

The anti-overshoot circuit embodiments of U.S. Ser. No. 327,348 operate in a similar manner. However, an anti-overshoot circuit transistor element AOCT initiates sacrificial current flow in an anti-overshoot circuit following transition from low to high potential and turn on of the output pullup transistor element P2 at the output. While the anti-overshoot circuit is not shown in the circuit example of FIG. 1, it is illustrated in other circuit figures of U.S. Ser. No. 327,348.

An anti-bounce circuit for the tristate output buffer of FIG. 1 incorporates the tristate control transistors, PMOS transistor P7 and NMOS transistor N7, as the anti-bounce transistor elements ABT of the anti-bounce circuit. The TCT's P7 and N7 are normally conducting in the bistate mode of operation presenting only a very low resistance to the propagation of data signals through the buffer. Upon detection of a ground bounce event by a ground bounce detector GBD circuit such as the circuit of FIG. 3, a transient ground bounce signal GBS of low potential is applied at the GBS input terminal drawing the current flow through the anti-bounce logic condition transistors ICT2 and OECT2. In the bistate mode of operation with a high level OE signal, the output enable condition transistor OECT2 is conducting. Similarly, with the appearance of a low level signal at the input $V_{IN}$ the network DIN delivers a high level signal to input condition transistor ICT2 so that it also is conducting. A low potential is therefore applied at the gate of anti-bounce NMOS transistor element N7 while a high level potential is applied at the gate of the anti-bounce PMOS transistor element P7.

Both the ABT's P7 and N7 are in the control path circuit of the pulldown transistor N2 and the transient turn off of transistors P7 and N7 increases resistance suppressing turn on of the pulldown transistor element N2 for the duration of the detected ground bounce event and ground bounce signal GBS. Upon correction of the ground bounce the GBS input signal rises to the normal high condition blocking current flow through the anti-bounce logic condition transistors ICT2 and OECT2. As a result the ABT's P7 and N7 conduct once again completing the turn on of pulldown transistor N2 and the transition from high to low potential at the output $V_{OUT}$. The TCTs P9 and N9 remain nonconducting during the bistate mode of operation with a high level OE signal and do not interfere in the operation of the anti-bounce circuit or the propagation through the output buffer.

A ground undershoot detector GUD circuit with two stages of current amplification and inversion for use with the circuit of FIG. 1 is illustrated in FIG. 2. FIG. 2 of the present patent application is the same as FIG. 10 of U.S. Ser. No. 327,348. A ground undershoot event in excess of the voltage threshold detection level between the noisy output ground lead branch PG and the quiet internal ground lead branch QG of a split lead is detected by the GUD transistor element N3 which is combined with complementary PMOS transistor P3. Transistor P3 is normally conducting and the output of the first stage N3, P3 is normally high except during transient occurrence of a detected ground undershoot event when the output of the first stage is at low potential. A second inverting stage 40 is added so that the final ground undershoot signal output GUS is high during a ground undershoot event.

A ground bounce detector GBD circuit providing two stages of current amplification generating a ground bounce signal GBS for use with the circuit in FIG. 1 is illustrated in FIG. 3. FIG. 3 of the present patent application corresponds with FIG. 7 of U.S. Ser. No. 327,348. The basic ground bounce detector transistor element and first stage of current amplification is provided by NMOS transistor N3 in combination with the complementary PMOS transistor P3. A ground bounce event in excess of the voltage threshold detection level between the noisy output ground lead branch PG and quiet internal ground lead branch QG of a split lead is detected by the NMOS transistor element N3. When transistor N3 is conducting during a ground bounce event, complementary transistor P3 is nonconducting and acts as a high resistance. The NMOS transistor pair N4, N5 provides a noninverting stage of current amplification for the final GBS of low potential.

More generally U.S. patent. application Ser. No. 327,348 provides an anti-noise circuit for dissipating parasitic tank circuit energy causing ground undershoot and $V_{CC}$ overshoot in the power rails of an integrated circuit output stage with switching output transistor elements. The output power rails include ground and supply output power rails characterized by lead inductance. As result the power rails are subject to power rail noise upon switching of the output transistor elements.

The anti-noise circuit for dissipating parasitic tank circuit energy broadly includes a current source for sourcing a transient sacrificial current and a dissipating resistance. The anti-noise circuit couples the current source, dissipating resistance, and power rail lead inductance in a sacrificial current path. A control circuit initiates the transient sacrificial current flow in the sacrificial current path following switching of an output transistor for dissipating parasitic tank circuit energy.

In the case of an anti-undershoot circuit, the power rail of interest is the ground rail and the sacrificial current path and dissipating resistance are provided by the anti-undershoot circuit transistor element AUCT. In the case of an anti-overshoot circuit the power rail of interest is the supply rail and the transient sacrificial current path and dissipating resistance are provided by the anti-overshoot transistor element AOCT. Furthermore, the same transistor can serve as both the AUCT and AOCT. Finally, the control circuit can be one of a variety of circuits to initiate sacrificial current flow through the AUCT/AOCT in response to detection of transient undershoot or overshoot voltages, a switching event at the input of the output stage, a switching event at the output of the output stage, or a combination of these circuit events.

U.S. Ser. No. 327,348 also contemplates a variety of low noise circuits incorporating the ground noise detector, supply noise detector, anti-ground bounce circuit, anti-$V_{CC}$ droop circuit, anti-ground undershoot circuit, and anti-$V_{CC}$ overshoot circuit in any of a variety of permutations and combinations.

While the anti-noise circuit and in particular the anti-undershoot and anti-overshoot circuit of U.S. Ser. No. 327,348 provides satisfactory operation in the low and intermediate frequency integrated circuit operating range, limitations are encountered in faster ICs operating for example in the 20–70 mhz range. The prolonged sacrificial current for dissipating parasitic tank circuit energy either in the form of undershoot or overshoot limits the speed of operation of the integrated circuit device, degrades the output characteristics, and increases dynamic power requirements.

OBJECTS OF THE INVENTION

It is therefore an object of the present invention to provide an improved anti-noise circuit for dissipating parasitic tank circuit energy in the output stage ground and supply leads of integrated circuits applicable for high speed, high frequency operation.

Another object of the invention is to provide an improved control circuit for the AUCT and AOCT of anti-undershoot and anti-overshoot circuits which actively turns off the AUCT, AOCT and cuts off prolonged sacrificial current upon occurrence of a following opposite edge switching event at the data input of the integrated circuit device. By this arrangement, the undershoot or overshoot dissipating sacrificial current is actively cut off commensurate with the speed of operation of the integrated circuit device.

A further object of the invention is to provide input condition feed forward transistor elements coupled between the data input and the output pullup and pulldown transistor elements of an output stage to provide fast turn off of the output pullup and pulldown transistor elements for high speed integrated circuit applications.

DISCLOSURE OF THE INVENTION

In order to accomplish these results the invention provides an anti-noise circuit for dissipating the parasitic tank circuit energy which causes ground undershoot and $V_{CC}$ overshoot in the power rails of an integrated circuit device. Such an integrated circuit device includes an output stage with a data input for receiving data signals of high and low potential and switching output transistor elements for transmitting data signals at an output. The integrated circuit device ground and supply output power rails are characterized by lead inductance subject to the power rail noise upon switching of the output transistor elements.

The elements of the anti-noise circuit according to the invention include a current source such as the power supply current source, and an anti-noise circuit transistor element separate from the switching output transistor elements. The anti-noise circuit transistor element has a primary current path, selected resistance in the primary current path providing electrical energy dissipating resistance, and a control node for controlling the conducting state of the anti-noise circuit transistor element. The anti-noise circuit couples the current source, anti-noise circuit transistor element with dissipating resistance in the primary current path, and the power rail lead inductance in series in a sacrificial current path.

A control circuit is coupled to the control node of the anti-noise circuit transistor element for causing a sacrificial current flow in the sacrificial current path following a first switching of potential levels at the output. The sacrificial current dissipates parasitic tank circuit energy in the dissipating resistance of the anti-noise circuit transistor element following the transition of potential levels at the output.

According to the invention the control circuit includes an active pullup and pulldown passgate coupled between the data input of the output stage and the control node of the anti-noise circuit transistor element. The passgate includes a passgate pullup transistor element and a passgate pulldown transistor element coupled for active turn off of the anti-noise circuit transistor element following a second or opposite edge switching of potential levels at the data input. The pullup and pulldown passgate transistor elements have control nodes coupled to the data input. The passgate output is coupled to the control node of the anti-noise circuit transistor element.

A feature of the control circuit with active pullup and pulldown passgate is that a sacrificial current is initiated through the anti-noise circuit transistor element following a transition of potential levels at the output for dissipating the parasitic tank circuit energy caused by switching of an output pullup or pulldown transistor element. More importantly, the active pullup and pulldown passgate promptly cuts off and terminates the sacrificial current following a second opposite going potential transition at the data input. The active pullup and pulldown passgate therefore resets the anti-noise circuit transistor element upon occurrence of the opposite edge transition at the data input at the frequency of operation of the integrated circuit device for high speed applications.

In the preferred example, the pullup passgate transistor element is a PMOS transistor element and the pulldown passgate transistor element is an NMOS transistor element. For a noninverting output stage the control nodes of the PMOS pullup and NMOS pulldown passgate transistor elements are coupled to the data input through an inverter. For an anti-undershoot circuit, the PMOS pullup passgate transistor element functions as the reset transistor element for rapid turn off of an anti-undershoot circuit transistor element AUCT in response to an opposite going edge signal at the data input. For an anti-overshoot circuit the NMOS pulldown passgate transistor element functions as the reset transistor element for rapid turn off of the anti-overshoot circuit transistor element AOCT in response to an opposite going edge signal at the data input.

The switching output transistor elements of the output stage are provided by an output pullup transistor element and an output pulldown transistor element. For the anti-noise circuit in the form of an anti-undershoot circuit, the anti-undershoot circuit couples the current source, an anti-undershoot circuit transistor element AUCT with dissipating resistance in the primary current path, and the ground output power rail lead inductance in series in a sacrificial current path. The control circuit is coupled to the AUCT to cause a sacrificial current flow in the sacrificial current path during switching on of the output pulldown transistor element during transition from high to low potential at the output. The sacrificial current dissipates parasitic ground undershoot energy from the ground output power rail in the dissipating resistance of the AUCT. The PMOS pullup passgate transistor element functions as the reset transistor to terminate the sacrificial current flow and reset the AUCT following an opposite going low to high potential transition at the data input.

According to another feature the invention also provides a first input condition feed forward transistor element ICFT1 coupled between the data input and a control node of an output pulldown transistor element. The ICFT1 causes rapid turn off of the output pulldown transistor element following the opposite going low to high potential transition at the data input, improving the speed of operation and the output characteristics of the integrated circuit device.

For an anti-noise circuit in the form of an anti-overshoot circuit, the anti-overshoot circuit couples the current source, anti-overshoot circuit transistor element AOCT with dissipating resistance, and supply output power rail lead inductance in series in the sacrificial current path. The control circuit is coupled to cause sacrificial current flow in the sacrificial current path during switching on of an output pullup transistor element during transition from low to high potential at the output. The sacrificial current dissipates parasitic $V_{CC}$ overshoot energy from the supply output power rail in the dissipating resistance of the AOCT. The NMOS pulldown passgate transistor element functions as the reset transistor cutting off and terminating the sacrificial current flow and resetting the AOCT following an opposite going high to low potential transition at the data input.

The invention also provides a second input condition feed forward transistor element ICFT2 coupled between the data input and a control node of an output pullup transistor element. The ICFT2 is coupled to provide rapid turn off of the output pullup transistor element following the opposite going high to low potential transition at the data input. The ICFT2 also improves speed and output characteristics of the integrated circuit device.

The invention can be applied in both bistate and tristate output buffer circuits. In the case of tristate circuits appropriate output enable OE and OE signals and corresponding output enable circuit transistor elements are provided for disabling the circuit elements in the tristate mode.

Other objects, features and advantages of the invention are apparent in the following specification and accompanying drawings.

BRIEF DESCRIPTION OF THE DRAWINGS

FIG. 4B is placed above FIG. 4A and FIG. 4C is placed below FIG. 4A for assembling FIG. 4.

DESCRIPTION OF PREFERRED EXAMPLE AND BEST MODE OF THE INVENTION

Figure 1:
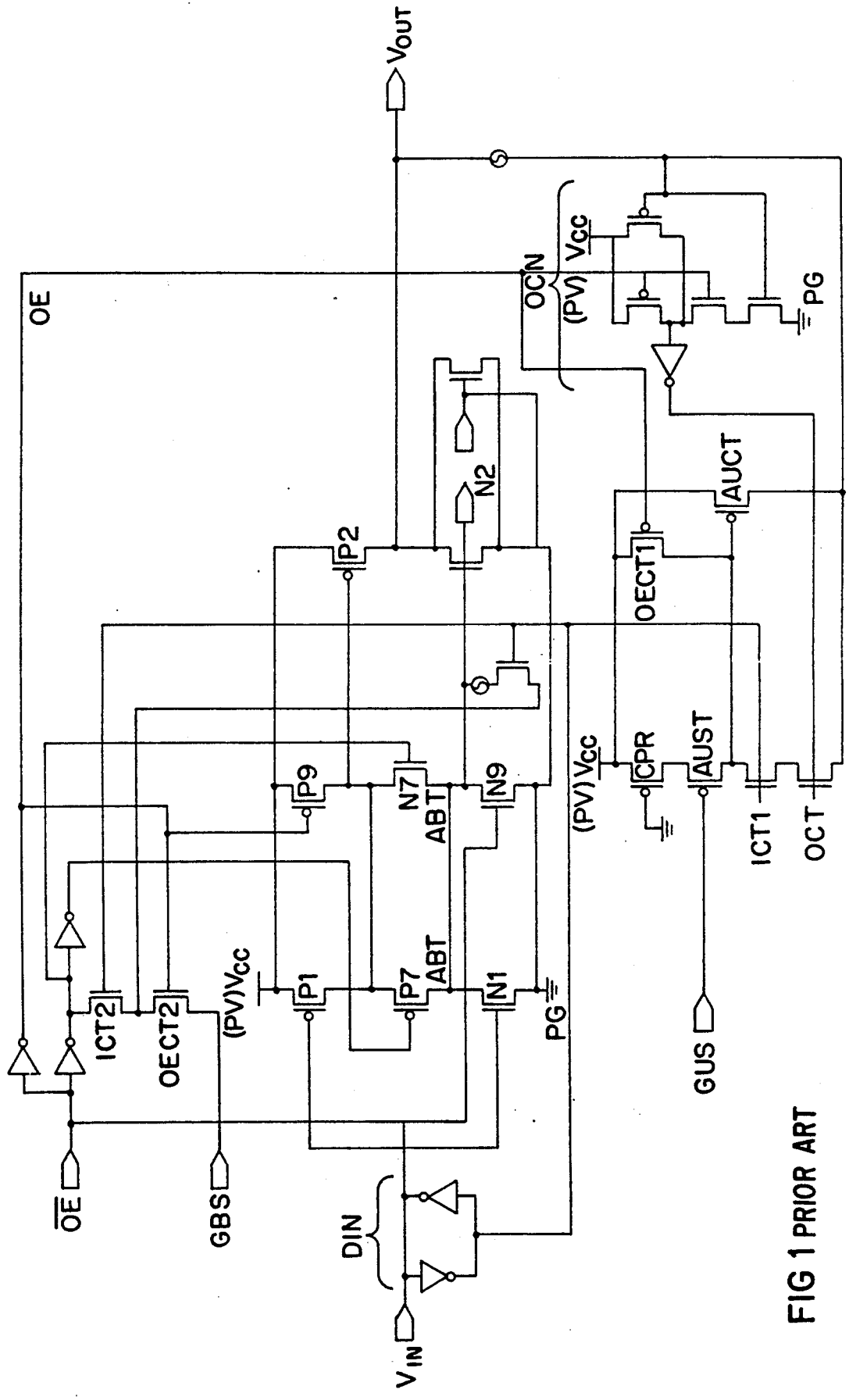
FIG. 1 is a schematic circuit diagram of the combined anti-noise circuit corresponding to FIG. 24 of the related U.S. patent application Ser. No. 327,348.
Figure 2:
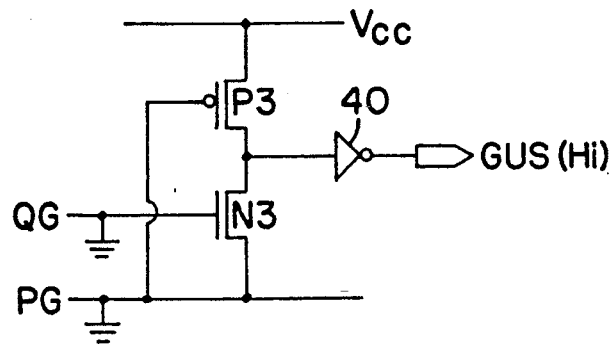
FIG. 2 is a fragmentary schematic circuit diagram of a ground undershoot detector GUD circuit for use with the circuit of FIG. 1 and corresponding to FIG. 10 of U.S. Ser. No. 327,348.
Figure 3:
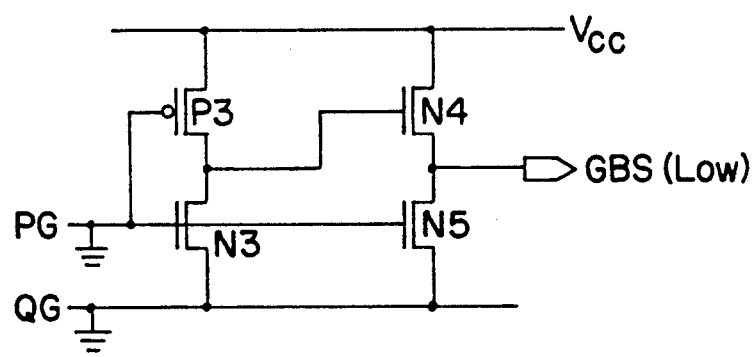
FIG. 3 is a fragmentary schematic circuit diagram of a ground bounce detector GBD circuit for use with the circuit of FIG. 1 and corresponding to FIG. 7 of U.S. Ser. No. 327,348.
Figure 4A:
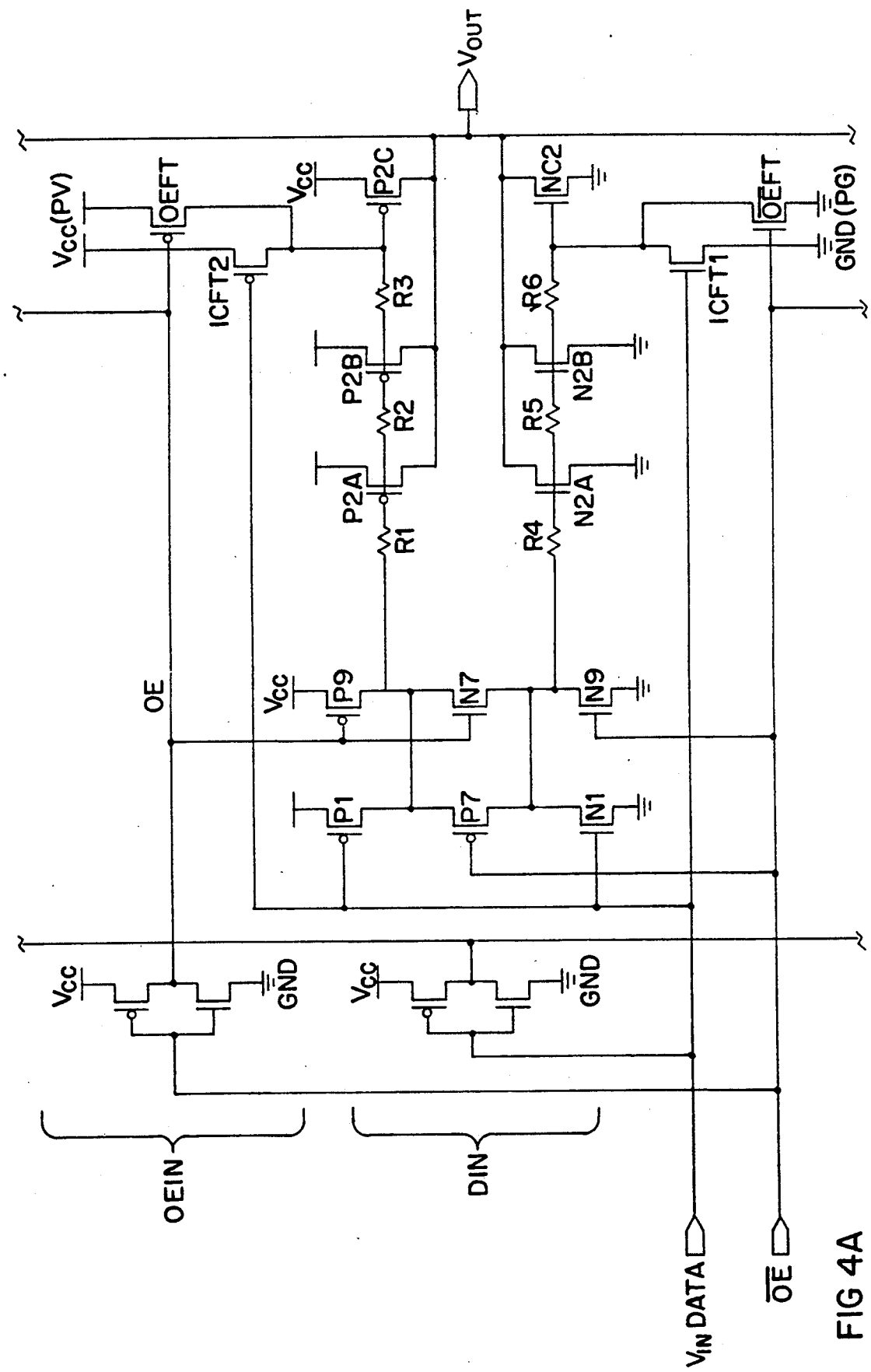
FIGS. 4A, 4B and 4C are fragmentary portions comprising FIG. 4 which when assembled together illustrate an output buffer with improved noise circuit according to the invention.
Figure 4B:
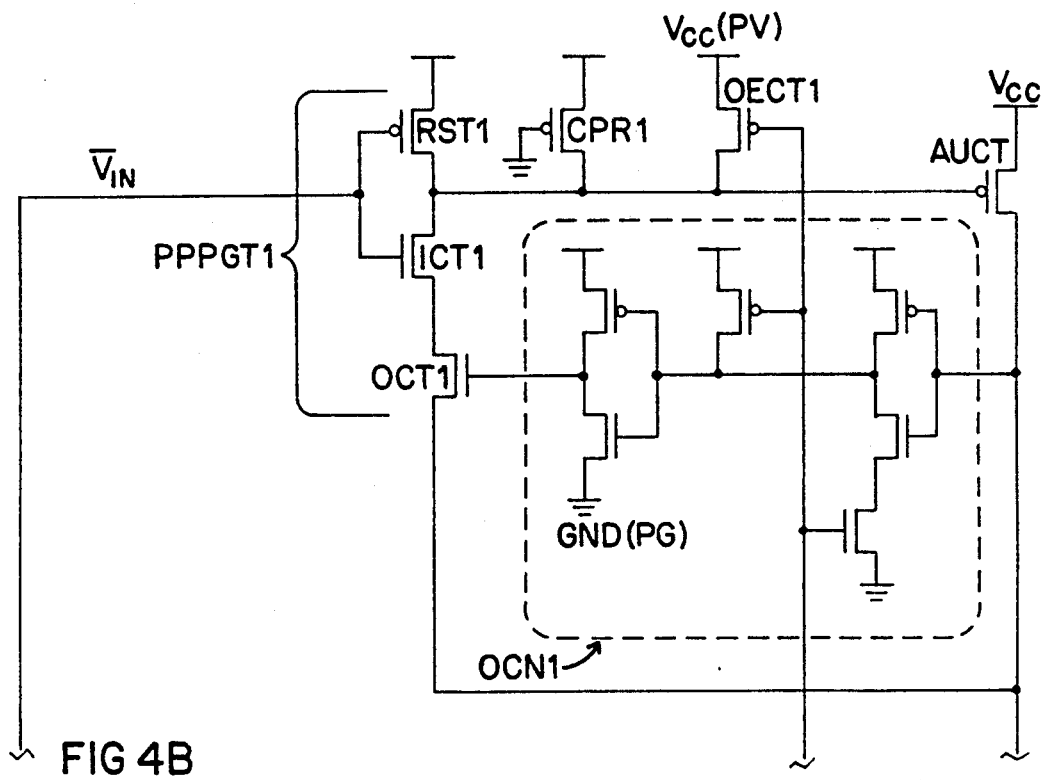
Figure 4C:
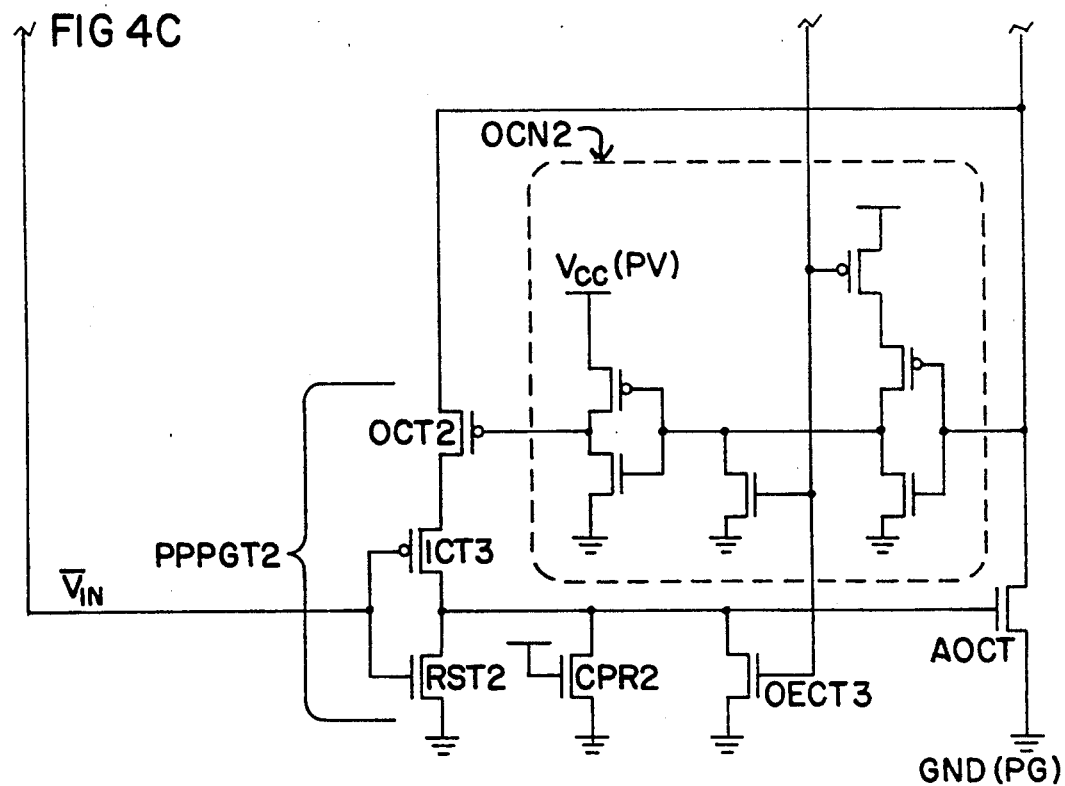

FIGS. 4A, 4B and 4C are assembled together to illustrate the improved anti-noise circuit according to the invention. The basic output buffer circuit appears primarily in FIG. 4A while the anti-undershoot circuit and anti-overshoot circuit portions appear primarily in FIGS. 4B and 4C. Circuit elements which perform substantially the circuit functions of the circuit elements of FIG. 1 are indicated by the same reference designations. The anti-ground bounce circuit of FIG. 1, however has been eliminated in the circuit of FIG. 4. As a result, the output enable OE transistor elements P7,N7,P9,N9 provide only the function of OE transistor elements for disabling the output stage during the tristate mode. The tristate transistor elements or TCT's P7,N7 do not function as anti-bounce transistor elements or ABT's as in FIG. 1.

Ground bounce and $V_{CC}$ droop are suppressed in the circuit of FIG. 4A by means of graduated turn on of the output pullup and pulldown transistor elements, P2,N2. To this end the output pulldown transistor N2 is divided into three parallel output pulldown transistor elements N2A,N2B,N2C. The graduated turn on output pulldown transistor elements, N2A, N2B, N2C are separated by delay resistors R4, R5 and R6. As a result, upon transition from high to low potential at the output $V_{OUT}$, a small sinking current is initiated by the relatively small channel width pulldown transistor elements N2A, N2B before the large sinking current is completed by relatively large channel width pulldown transistor element N2C. By this arrangement ground bounce in the output power ground is divided into smaller increments avoiding a large spike.

Similarly on the pullup side of the output stage the output pullup transistor element P2 is divided into pullup transistor elements P2A, P2B and P2C separated by delay resistors R1, R2 and R3. Upon transition from low to high potential level at the output $V_{OUT}$ the relatively small channel width pullup transistor elements P2A, P2B initiate small increments of sourcing current before the large sourcing current is completed by pullup transistor element P2C. By this arrangement the $V_{CC}$ droop is divided into smaller increments avoiding a large spike. Exemplary values for the graduated turn on components are shown in TABLE I. Delay resistors R3 and R6 include programmable P type and N type diffused resistors in range, of for example 2 K ohms.

Further disclosure and background on reducing switching induced noise using graduated turn on and bifurcated turn on of the output pullup and pulldown transistor elements is found in the Jeffrey B. Davis U.S. Pat. No. 4,961,010 issued Oct. 2, 1990 and the Jeffrey B. Davis U.S. patent application Ser. No. 483,927, filed Feb. 22, 1990 and assigned to the same assignee as the present patent application.

The anti-undershoot circuit portion of the invention is illustrated in FIG. 4B. The circuit elements AUCT, OCN1, OECT1, CPR1, OCT1, and ICT1 of FIG. 4B operate as substantially the same circuit structures in substantially the same manner and with the same circuit functions as the circuit elements AUCT, OCN, OCET1, CPR, OCT, and ICT1 described with reference to FIG. 1. It is noted that in the circuit of FIG. 4 the anti-noise circuit is simplified in so far as the AUST with GUS input has been eliminated. The control path resistor CPR1, a gate grounded PMOS transistor element is selected with channel width and length dimensions of 14, 18 respectively to replace the CPR and AUST of FIG. 1. The AUST with GUS control may optionally be retained and incorporated, however, in the circuit of FIG. 4.

The improvement and enhancement of the anti-undershoot circuit according to the invention as illustrated in FIG. 4B is the addition of PMOS pullup transistor element RST1 which functions as a reset transistor for active turn off and resetting of the anti-undershoot circuit transistor element AUCT as hereafter described. As shown in FIG. 4B the PMOS reset transistor element RST1 is combined with the NMOS input condition transistor element ICT1 to form an inverting passgate with pullup and pulldown transistor elements. The control nodes of the inverting passgate pullup and pulldown transistor elements are coupled to the data input through the data input network invertor DIN. The conducting states of the inverting passgate pullup and pulldown transistor elements RST1, ICT1 are conditioned by the inverted gate input signal $V_{IN}$ and are in opposite phase.

Furthermore, the primary current path of the NMOS input condition transistor element ICT1 is coupled in series with the NMOS output condition transistor element OCT1, another passgate element whose conducting state is conditioned by the logic state at the output $V_{OUT}$ of the output buffer circuit through the output condition network OCN1. The logic condition transistor elements RST1, ICT1, OCT1, together form a combination active pullup and pulldown passgate designated PPPGT1 having at least one PMOS pullup transistor element RST1, and at least one NMOS pulldown transistor element ICT1, in this case coupled in series with a second NMOS transistor element OCT1.

With steady state high potential level signals at both the input $V_{IN}$ and the output $V_{OUT}$, the high potential level signal at the output through the output condition network OCN1 conditions the output condition transistor element OCT1 so that it is in the conducting state. However the inverted input signal $V_{IN}$ of low potential holds the passgate transistor element ICT1 in the nonconducting state and the pullup passgate transistor element RST1 in the conducting state. As a result the gate of PMOS transistor element AUCT is charged by both RST1 and CPR1 so that AUCT is not conducting and there is no sacrificial current. Upon an opposite edge transition from high to low potential at the data input the pullup passgate transistor element turns off while pulldown passgate transistor element ICT1 turns on. The second pulldown passgate transistor element OCT1 is already conducting and remains conducting during propagation delay of the low potential data signal through the output buffer circuit. The gate of the anti-undershoot circuit transistor element is therefore discharged so that AUCT conducts sacrificial current in the sacrificial current path.

After propagation of the low potential signal to the output $V_{OUT}$, the output condition network OCN1 turns off the output condition transistor element OCT1 blocking discharge current from the gate of AUCT. The bleed current through CPR1 begins to charge the gate of AUCT but the sacrificial current is prolonged for dissipation of parasitic tank circuit undershoot energy because of the resistance of CPR1. If an opposite edge low to high transition now occurs at the data input $V_{IN}$ during occurrence of the prolonged sacrificial current, the inverted data signal $V_{IN}$ of low potential turns on the pullup passgate transistor element RST1 rapidly charging the gate of AUCT, resetting AUCT to the nonconducting state and cutting off the sacrificial current flow through the output $V_{OUT}$. As a result, the anti-undershoot circuit is reset each cycle at the frequency of operation of the integrated circuit device for high speed applications without degradation of output switching characteristics and with improved power requirements.

The anti-overshoot circuit portion of the anti-noise circuit illustrated in FIG. 4C is a mirror image of the anti-undershoot circuit both in structure and function. In the anti-overshoot circuit of FIG. 4C however the inverting passgate transistor elements having control nodes coupled to the data input through the data input inverting network DIN are provided by pullup passgate transistor element ICT3 and pulldown passgate transistor element RST2. Thus, as shown in FIG. 4C the NMOS pulldown transistor element RST2 provides the reset transistor for rapid turn off of the anti-overshoot circuit transistor element AOCT upon occurrence of an opposite edge signal transition from high to low potential at the data input $V_{IN}$. The passgate transistor element is provided by the input condition transistor element ICT3 having its primary current path coupled in series with the PMOS output condition transistor element OCT2.

The series coupled PMOS passgate elements ICT3 and OCT2 in combination with the NMOS pulldown passgate transistor element RST2 provide the second active pullup and pulldown passgate designated PPPGGT2 for active control of both the turn on and turn off of the AOCT. Thus the anti-overshoot circuit transistor element is controlled for initiating sacrificial current to dissipate parasitic tank circuit overshoot energy during a low to high potential transition at the output. Upon occurrence of an opposite edge transition at the data input, the reset transistor element RST2 provides rapid resetting of the AOCT and cutoff of the sacrificial current according to the frequency of operation of the integrated circuit device. In other respects the elements of the anti-overshoot circuit operate in the same manner as the analogous elements of the anti-undershoot circuit. Exemplary values for the anti-undershoot and anti-overshoot circuit components are listed in TABLE II.

Referring to the basic output buffer circuit of FIG. 4A, improvement in speed and output switching characteristics is further provided by the input condition feed forward transistor elements ICFT1 and ICFT2. The input data signal $V_{IN}$ fed forward to NMOS pulldown transistor element ICFT1 affords rapid turn off of the large output pulldown transistor element NC2 in response to a low to high going transition at the data input. Feed forward of the data input signal $V_{IN}$ to the PMOS feed forward pullup transistor element ICFT2 affords rapid turn off of the relatively large output pullup transistor element P2C in response to a high to low going transition at the data input. Because the anti-noise circuit is illustrated in a tristate output buffer circuit embodiment OE feed forward transistor elements OEFT and $\overline{OFT}$ are also provided for disabling the input condition feed forward transistor elements ICFT2 and ICFT1 in the tristate mode. To this end an OE inverting network OEIN is provided for delivering an OE signal in response to an $\overline{OE}$ signal at the $\overline{OE}$ input. The anti-noise circuit may of course also be embodied in a bistate output buffer circuit without tristate control elements.

While the invention has been described with reference to particular example embodiments it is intended to cover all modifications and equivalents within the scope of the following claims.

TABLE I

| Graduated Turn On Example Component Values FIG. 4A | |
|---|---|
| Component | Channel Width μ or Resistance Ω |
| P2A | 265μ |
| P2B | 265μ |
| P2C | 1320μ |
| N2A | 100μ |
| N2B | 100μ |
| N2C | 800μ |
| R1 | 100Ω |
| R2 | 212Ω |
| R3 | 100Ω + RPDiff:0-5K |
| R4 | 150Ω |
| R5 | 300Ω |
| R6 | 150Ω + RNDiff:0-5k |

TABLE II

| Anti-Undershoot & Anti-Overshoot Circuit Example Component Values | |
|---|---|
| Component | Channel Width μ |
| RST1 | 27μ |
| ICT1 | 14μ |
| OCT1 | 14μ |
| CPR1 | 14μ |
| OECT1 | 14μ |
| AUCT | 248μ |
| RST2 | 14μ |
| ICT3 | 27μ |
| OCT2 | 27μ |
| CPR2 | 8μ |
| OECT3 | 14μ |
| AOCT | 128μ |

I claim:

1. An anti-noise circuit for dissipating parasitic tank circuit energy causing ground undershoot and $V_{CC}$ overshoot in the power rails of an integrated circuit device, said integrated circuit device having an output stage with a data input ($V_{IN}$) for receiving data signals of high and low potential and switching output transistor elements (N2,P2) for transmitting data signals at an output ($V_{OUT}$), said integrated circuit device having ground and supply output power rails (PG,PV) characterized by lead inductance subject to power rail noise upon switching of the output transistor elements comprising:

a current source (PV);
an anti-noise circuit transistor element (AUCT, AOCT) separate from the switching output transistor elements (N2,P2) having a primary current path and selected resistance in the primary current path providing dissipating resistance, said anti-noise circuit transistor element having a control node for controlling the conducting state of the anti-noise circuit transistor element;
said anti-noise circuit coupling the current source (PV), said anti-noise circuit transistor element (AUCT, AOCT) with dissipating resistance, and said power rail lead inductance in series in a sacrificial current path;
and control circuit means coupled to the control node of the anti-noise circuit transistor element (AUCT, AOCT) for causing a sacrificial current flow in the sacrificial current path following a first switching of potential levels at the output ($V_{OUT}$) for dissipating parasitic tank circuit energy in said dissipating resistance;
said control circuit means comprising an active pullup and pulldown passgate (PPPGT1) coupled between the data input and the control node of the anti-noise circuit transistor element, said passgate including a pullup passgate transistor element (RST1,ICT3) and a pulldown passgate transistor element (ICT1,RST2), said passgate being coupled to actively turn off of the anti-noise circuit transistor element (AUCT,AOCT) following a second switching of potential levels of the data input.

2. The anti-noise circuit of claim 1 wherein the pullup and pulldown passgate transistor elements (RST1,ICT1) (ICT3,RST2) have control nodes coupled to the data input ($V_{IN}$) and wherein the passgate has a passgate output coupled to the control node of the anti-noise circuit transistor element (AUCT, AOCT).

3. The anti-noise circuit of claim 2 wherein the pullup passgate transistor element (RST1, ICT3) is a PMOS transistor element and the pulldown passgate transistor element (ICT1, RST2) is an NMOS transistor element, said pullup and pulldown passgate transistor elements having control nodes coupled to the data input ($V_{IN}$) through an inverter (DIN).

4. The anti-noise circuit of claim 1 wherein the switching output transistor elements comprise an output pullup transistor element (P2) and an output pulldown transistor element (N2), wherein the anti-noise circuit couples the current source, anti-noise circuit transistor element (AUCT) with dissipating resistance means, and ground output power rail lead inductance in series in a sacrificial current path, wherein the control circuit means is coupled to cause a sacrificial current flow in the sacrificial current path during switching on of an output pulldown transistor element (N2) for dissipating parasitic ground undershoot energy from the ground output power rail (PG) in the dissipating resistance means, and wherein the pullup passgate transistor element (RST1) is coupled to terminate the sacrificial current flow following a low to high potential transition at the data input ($V_{IN}$).

5. The anti-noise circuit of claim 1 wherein the switching output transistor elements comprise an output pullup transistor element (P2) and an output pulldown transistor element (N2), wherein the anti-noise circuit couples the current source, anti-noise circuit transistor element (AOCT) with dissipating resistance means, and supply output power rail lead inductance in series in the sacrificial current path, wherein the control circuit means is coupled to cause sacrificial current flow in the sacrificial current path during switching on of an output pullup transistor element (P2) for dissipating parasitic $V_{CC}$ overshoot energy from the supply output power rail (PV) in the dissipating resistance means, and wherein the pulldown passgate transistor element (RST2) is coupled to terminate the sacrificial current flow following a high to low potential transition at the data input.

6. The anti-noise circuit of claim 4 further comprising a first input condition feed forward transistor element (ICFT1) coupled between the data input ($V_{IN}$) and a control node of an output pulldown transistor element (N2) for rapid turn off of said output pulldown transistor element (N2) following a low to high potential transition at the data input.

7. The anti-noise circuit of claim 5 further comprising a second input condition feed forward transistor element (ICFT2) coupled between the data input ($V_{IN}$) and a control node of an output pullup transistor element (P2) for rapid turn off of said output pullup transistor element (P2) following a high to low potential transition at the data input.

8. The anti-noise circuit of claim 4 wherein the control circuit means comprises an anti-undershoot control path resistance element (CPR1) coupled between the output supply (PV) and said anti-noise circuit transistor element (AUCT) control node for delaying turn off of the anti-noise circuit transistor element (AUCT) and enabling a transient sacrificial flow of current in the anti-noise circuit following transition from high to low potential at the output.

9. The anti-noise circuit of claim 5 wherein the control circuit means comprises an anti-overshoot control path resistance element (CPR2) coupled between the output ground rail (PG) and said anti-noise circuit transistor element (AOCT) control node for delaying turn off of the anti-noise circuit transistor element (AOCT) and enabling a transient sacrificial flow of current in the anti-noise circuit following transition from low to high potential at the output.

10. An anti-undershoot circuit for an integrated circuit having at least one output stage with an output ground lead comprising an output ground (PG), and an output supply lead comprising an output supply (PV), said output stage comprising a data input ($V_{IN}$) for receiving data signals of high and low potential and an output ($V_{OUT}$) for delivering data signals, an output pulldown transistor element (N2) coupled between the output and output ground (PG) for sinking current from the output to output ground, and an output pullup transistor element (P2) coupled between the output supply (PV) and the output for sourcing current from the output supply to the output, said transistor elements each comprising a primary current path and primary current path first and second nodes, and a control node and control circuit for controlling the conducting state of the primary current path, said output ground being subject to ground noise including ground undershoot of potential due to output ground lead inductance during transition from high to low potential at the output, said anti-undershoot circuit comprising:

an anti-undershoot circuit transistor element (AUCT) having the primary current path first and second nodes coupled in an anti-undershoot circuit, said anti-undershoot circuit comprising a current source (PV), the primary current path of the AUCT, and said output ground lead inductance coupled in series;

an AUCT control circuit (CPR1, RST1, ICT1, OCT1, OCN1) coupled to the control node of the AUCT for establishing flow of a sacrificial current from said current source through the AUCT primary current path and through the output ground lead inductance upon switching on of the output pulldown transistor element during a high to low potential transition at the output, said AUCT comprising selected resistance in the primary current path in the conducting state for dissipating undershoot electrical energy from the output ground lead inductance thereby damping ground undershoot of potential in the output ground;

said AUCT control circuit comprising an active pullup and pulldown passgate (PPPGT1) coupled between the data input and said AUCT control node, said passgate comprising a pullup passgate transistor element (RST1) and a pulldown passgate transistor element (ICT1) having control nodes coupled to the data input, and a passgate output coupled to the control node of the AUCT, said passgate being coupled for active turn off of the sacrificial current flow upon a low to high potential transition at the data input ($V_{IN}$).

11. The anti-undershoot circuit of claim 10 wherein the anti-undershoot circuit is coupled between the output supply PV and output ground PG through the output ($V_{OUT}$) of said output stage, wherein the primary current path first and second nodes of the AUCT are coupled in parallel with the primary current path first and second nodes of the output pullup transistor element (P2), and further comprising an anti-undershoot control path resistance element (CPR1) coupled in the control circuit of the AUCT between the output supply (PV) and the control node of the AUCT, said CPR1 retarding turn off of the AUCT following transition from high to low potential at the output thereby establishing the sacrificial current flow through the primary current path resistance of the AUCT and the output ground lead inductance for dissipation of undershoot electrical energy stored in the output ground lead inductance, said CPR1 being coupled in parallel with the primary current path of the pullup passgate transistor element (RST1).

12. The anti-undershoot circuit of claim 11 wherein the respective primary current path first nodes of the AUCT and output pullup transistor element are coupled to the output supply PV, the respective primary current path second nodes of the AUCT and output pullup transistor element are coupled to the output of said output stage, and the control node of the AUCT is coupled to the output supply (PV) through said control path resistance element (CPR1 for delaying turn off of the AUCT thereby establishing the sacrificial current flow.

13. The anti-undershoot circuit of claim 10 wherein the AUCT control circuit comprises an anti-undershoot control path resistance element (CPR1) coupled between the output supply PV and the control node of the AUCT for sourcing current to the control node of the AUCT through said CPR1 resistance element, and a logic condition transistor element (OCT1) having the primary current path operatively coupled to the control node of the AUCT, a control node of said logic condition transistor element (OCT1) being operatively coupled to the output of said output stage for conditioning and controlling the conducting state of the AUCT in response to the logic condition of the output.

14. The anti-undershoot of claim 10 wherein the AUCT control circuit comprises a plurality of logic condition transistor elements including a data input condition transistor (ICT1) and an output condition transistor (OCT1) operatively coupled with respective primary current paths in series between the AUCT control node and output ground, said output supply (PV) being coupled to the AUCT control node through a control path resistance element (CPR1), said ICT1 being conditioned by the signal at the input of the output stage and said OCT1 being conditioned by the signal at the output of the output stage to control transient conduction through the primary current path of the AUCT associated with transition from high to low potential at the output for establishing the sacrificial current in the anti-undershoot circuit from the output supply, through the AUCT primary current path and primary current path selected resistance, and through the output ground lead inductance, for dissipating electrical energy stored in the power ground lead inductance.

15. The anti-undershoot circuit of claim 14 further comprising an output condition network (OCN1) operatively coupled between the output ($V_{OUT}$) and control node of the OCT1 for conditioning propagation of an output condition signal to the control node of the OCT1 for effecting a slow rise in the sacrificial current during turn on of the AUCT to reduce interference in the output supply PV by the current requirements of the AUCT.

16. The anti-undershoot circuit of claim 14 wherein the output stage comprises a tristate output device with output enable signals (OE,$\overline{OE}$) and wherein the AUCT control circuit further comprises an output enable condition transistor element (OECT1) operatively coupled to the AUCT control circuit for disabling the AUCT in the high impedance third state of the tristate output device.

17. The anti-noise circuit of claim 10 further comprising a first input condition feed forward transistor element (ICFT1) coupled between the data input ($V_{IN}$) and a control node of an output pulldown transistor element (N2) for rapid turn off of said output pulldown transistor element following a low to high potential transition at the data input.

18. The anti-noise circuit of claim 17 further comprising a second input condition feed forward transistor element (ICFT2) coupled between the data input ($V_{IN}$) and a control node of an output pullup transistor element (P2) for rapid turn off of said output pullup transistor element following a high to low potential transition at the data input.

19. An anti-overshoot circuit for a multi-stage circuit having an output stage with an output $V_{CC}$ supply lead comprising an output supply (PV) said output supply lead having lead inductance said output stage comprising an input ($V_{IN}$) for receiving data signals of high and low potential and an output ($V_{OUT}$) for delivering data signals, an output pulldown transistor element (N2) coupled between the output ($V_{OUT}$) and ground (PG) for sinking current from the output to ground, and an output pullup transistor element (P2) coupled between the output supply (PV) and the output for sourcing current from the output supply to the output, said transistor elements comprising a primary current path and primary current path first and second nodes, and a control node and control circuit for controlling the conducting state of the primary current path, said anti-overshoot circuit comprising:

an anti-overshoot circuit transistor element (AOCT) having the primary current path first and second nodes coupled in an anti-overshoot circuit coupling the output supply PV, primary current path of the AOCT, ground, and output supply lead inductance in series;

an AOCT control circuit (CPR2, RST2, ICT3, OCT2, OCN2) coupled to the control node of the AOCT for establishing transient flow of a sacrificial current through the AOCT primary current path from said output supply-PV and through the output supply lead inductance following a low to high potential transition at the output, said AOCT comprising selected resistance in the primary current path in the conducting state providing dissipating resistance means for dissipating overshoot electrical energy stored in the output supply PV lead inductance;

said AOCT control circuit comprising an active pullup and pulldown passgate coupled between the data input and the control node of the AOCT, said passgate comprising a pullup passgate transistor element (ICT3) and a pulldown passgate transistor element (RST2) having control nodes coupled to the data input and a passgate output coupled to the AOCT control node for active turn off of the sacrificial current upon transition from low to high potential at the data input ($V_{IN}$).

20. The anti-overshoot circuit of claim 19 further comprising an input condition feed forward transistor element (ICFT2) coupled between the data input ($V_{IN}$) and a control node of an output pullup transistor element (P2) for fast turn off of the output pullup transistor element (P2) upon transition from high to low potential at the data input ($V_{IN}$).

* * * * *